United States Patent [19]
Harada

[11] Patent Number: 5,606,192
[45] Date of Patent: Feb. 25, 1997

[54] SEMICONDUCTOR INTEGRATED CIRCUITS HAVING BIPOLAR TRANSISTORS AND LDD-STRUCTURED MOSFET

[75] Inventor: Hiroshi Harada, Tokyo, Japan

[73] Assignee: NEC Corporation, Tokyo, Japan

[21] Appl. No.: 662,525

[22] Filed: Jun. 13, 1996

Related U.S. Application Data

[63] Continuation of Ser. No. 357,199, Dec. 13, 1994, abandoned.

[30] Foreign Application Priority Data

Dec. 17, 1993 [JP] Japan .................................. 5-317985

[51] Int. Cl.$^6$ .................. H01L 29/76; H01L 29/94; H01L 31/062; H01L 31/113
[52] U.S. Cl. ................ 257/377; 257/382; 257/412
[58] Field of Search ......................... 257/377, 382, 257/412

[56] References Cited

U.S. PATENT DOCUMENTS 4,808,548  2/1989  Thomas et al. ..................... 257/377
4,949,136  8/1990  Jain .................................... 257/377
5,319,234  6/1994  Uga et al. ........................... 257/378

FOREIGN PATENT DOCUMENTS 61-139067   6/1986  Japan ................................ 257/412
4-288868   10/1992  Japan .

*Primary Examiner*—Stephen Meier
*Attorney, Agent, or Firm*—Young & Thompson

[57] ABSTRACT

A semiconductor IC comprises an LDD-MOSFET and a bipolar transistor both formed on a common semiconductor substrate. A gate electrode of the MOSFET has a laminated structure including a polysilicon layer, a tungsten silicide layer and another polysilicon layer consecutively formed. The top polysilicon layer functions for protecting the tungsten silicide layer so that tungsten is not back-sputtered to deposit particulates on a base region of the bipolar transistor during an anisotropic etching step for forming sidewall spacers of the gate electrode. Accordingly, a sputter-etch cleaning step for removing tungsten particulates out of the base region is omitted. A BiCMOS IC having an LDD structure and comprising a bipolar transistor with required performance can be manufactured by a simple process.

7 Claims, 2 Drawing Sheets

SEMICONDUCTOR INTEGRATED CIRCUITS HAVING BIPOLAR TRANSISTORS AND LDD-STRUCTURED MOSFET

This application is a continuation of application Ser. No. 08/357,199, filed Dec. 13, 1994, now abandoned.

BACKGROUND OF THE INVENTION (a) Field of the Invention

The present invention relates to a semiconductor integrated circuit and, more particularly, to a semiconductor integrated circuit wherein a bipolar transistor and a MOSFET are formed on a common semiconductor substrate.

(b) Description of the Related Art

A semiconductor integrated circuit in which a MOSFET and a bipolar transistor are formed on a common semiconductor substrate is known as a BiCMOS integrated circuit (referred to as "a BiCMOS IC" hereinafter). A conventional method for manufacturing a BiCMOS IC having an LDD (Lightly Doped Drain) structure will be described first.

FIG. 1 is a cross-sectional view showing a BiCMOS IC in a process step of a first conventional method for manufacturing the same. A polysilicon layer 53 and a tungsten silicide layer 54 are formed in this order on a gate oxide film 52 formed on a semiconductor substrate 51. The polysilicon layer 53 and the tungsten silicide layer 54 are then patterned to form a gate electrode.

For obtaining an LDD structure, an oxide film is subsequently grown covering the entire surface of the substrate, which is followed by an anisotropic etching to form sidewall spacers 55 on both sides of the gate electrode. Since the tungsten silicide layer 54 is used as an etch-stop layer during the anisotropic etching, the tungsten silicide layer 54 is back-sputtered by plasma ions so that tungsten particulates scatter into an ambient atmosphere.

The scattered tungsten particulates adhere onto the surface of a base region in a bipolar transistor exposed to the reaction atmosphere. If the BiCMOS IC is manufactured leaving the tungsten particulates as they are, the tungsten particulates will induce a leakage current from the base region. Hence, it is necessary to remove the tungsten particulates out of the base region.

Accordingly, after the etching for forming the sidewall spacers is finished, a slight sputter etching with argon ions is performed on the base region, with the surface of the substrate except for the base region being covered by a photoresist pattern. Then, after forming a thin oxide film, the base region is doped with an impurity, following which an emitter electrode is formed, whereby a bipolar transistor is obtained. Thus, a BiCMOS IC having a MOSFET of the LDD structure and a bipolar transistor is manufactured.

The first method requires the step for covering the silicon substrate except for the base region with a photoresist pattern and the step for sputter-etching the silicon substrate in the base region. Especially, the method involves the time-consuming step for aligning a mask with the actual patterns without an automated alignment prior to exposing a photoresist film so that the fabrication process is complex and consumes a long period of time.

A second method is proposed by, for example, JP-A-92-288,868 in which the leakage current from the base region is reduced. In this method, a polysilicon gate electrode of a MOSFET is formed after introducing a dopant into the base region. Subsequently, a second polysilicon layer is sputter-deposited to form an emitter electrode. Only the emitter region is then covered by a photoresist pattern. The second polysilicon layer are then selectively removed by an anisotropic etching so that the emitter electrode and sidewall spacers of the gate electrode are simultaneously formed. In this case, the surface of the base regions is not affected by an anisotropic etching because the base region is located under the second polysilicon layer of the emitter electrode. The second conventional method, however, has a drawback in which a gate length designed for defining a finer pattern to obtain a short channel is substantially increased by the presence of the sidewall spacers, namely the presence of so called auxiliary gate electrodes, since the sidewall spacers formed together with the emitter electrode in a common step are comprised of a conductive polysilicon film. Another drawback is that it is difficult to control the etch rates since an etching of the spacers and the emitter electrode induces also an etching of a gate electrode itself.

SUMMARY OF THE INVENTION

In view of the foregoing, it is an object of the present invention to provide an improved semiconductor IC in which a MOSFET having an LDD structure and a bipolar transistor are formed on a common substrate without employing a complex process or an increase in a gate length.

In accordance with present invention, there is provided a semiconductor IC comprising: a semiconductor substrate having a main surface; at least one MOSFET formed on said main surface and having a lightly doped drain, a gate electrode laminate and a sidewall spacer formed on a side of said gate electrode laminate adjacent to said lightly doped drain, said gate electrode laminate including a top layer made of a material containing substantially no refractory metal; and a bipolar transistor formed on said main surface.

It is preferable that the gate electrode comprises a polysilicon layer, a tungsten silicide layer and a polysilicon layer consecutively laminated in this order.

In the semiconductor IC according to the present invention, tungsten particulates do not scatter into the base region of the bipolar transistor during etching for forming sidewall spacers on the both sides of the gate electrode since the gate electrode is composed of a plurality of conductive layers and the uppermost layer is a conductive layer not containing tungsten. Consequently, the bipolar transistor can be formed without a step for removing tungsten particulates from the base region. Similarly, forming the sidewall spacers does not substantially increase the gate length.

Accordingly, the present invention can provide a semiconductor IC with required performances at a lower cost.

BRIEF DESCRIPTION OF THE DRAWINGS

The above and other objects, features and advantages of the present invention will be more apparent from the following description, referring to the accompanying drawings in which.

DESCRIPTION OF THE PREFERRED EMBODIMENT

Preferred embodiments of the present invention will now be described with reference to the drawings. FIGS. 2–5 show a semiconductor IC according to an embodiment of the present invention in consecutive steps of a manufacturing process therefor. The semiconductor IC is manufactured as described below.

Figure 1:
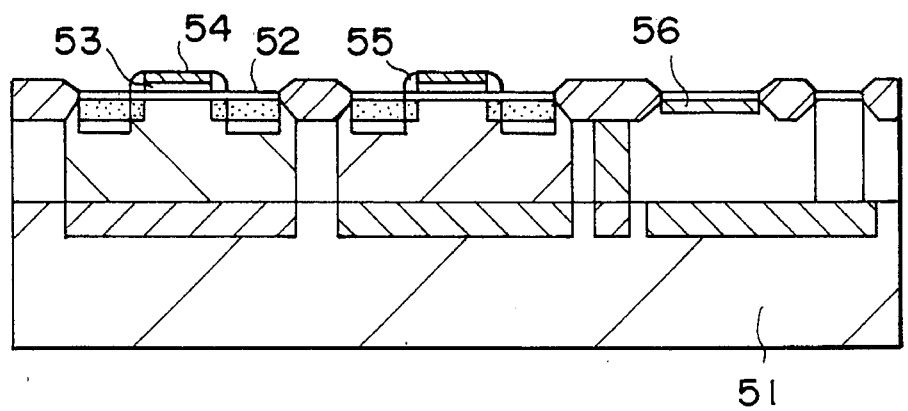
FIG. 1 is a cross-sectional view of a conventional semiconductor IC in a step of a manufacturing process therefor.
Figure 2:
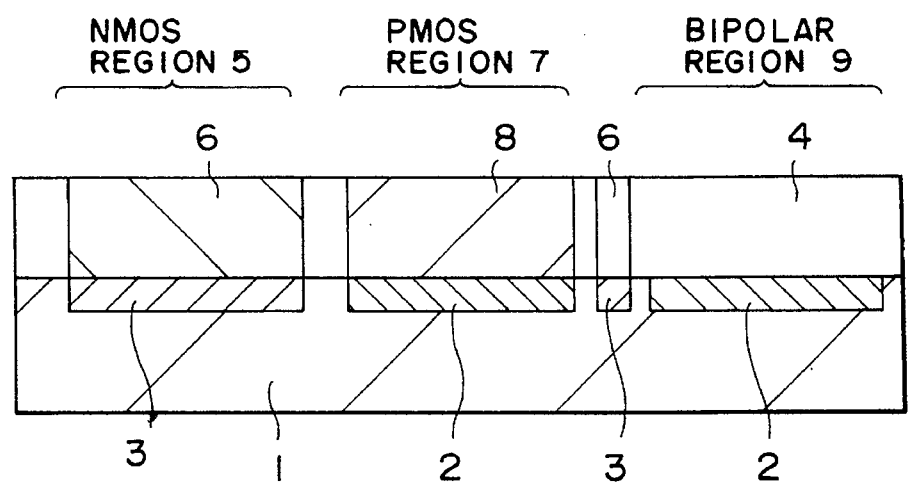
FIG. 2 is a cross-sectional view of a semiconductor IC according to an embodiment of the present invention in a step of a manufacturing process therefor.

Referring first to FIG. 2, arsenic and boron ions are consecutively implanted into a P-type silicon substrate 1 to form N-type buried layers 2 and a P-type buried layers 3, respectively. Subsequently, an N-type epitaxial layer 4 is grown on the buried layers 2 and 3. Boron ions are implanted into the epitaxial layer 4 to form a P-well layer 6 in an NMOS region 5 while phosphorus ions are implanted into the epitaxial layer 4 to form an N-well layer 8 in a PMOS region 7. As a result, a semiconductor active layer for each transistor is formed to provide a structure shown in FIG. 2. In the step described heretofore, no ion-implantation step is carried out for a bipolar region 9.

Figure 3:
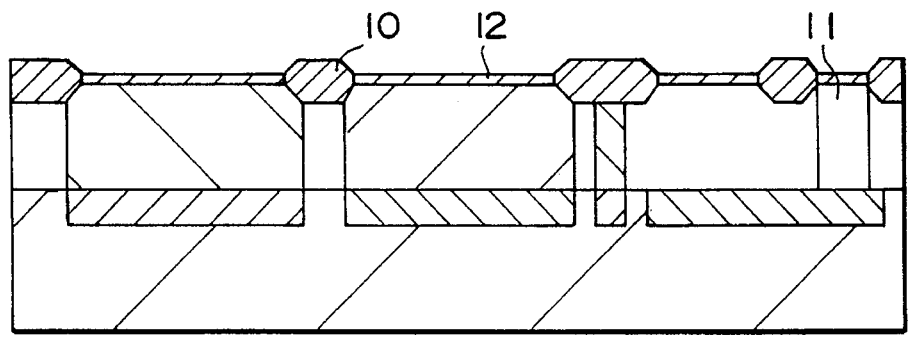
FIG. 3 is a cross-sectional view of the semiconductor IC according to the embodiment of the present invention in another step of the manufacturing process.

Subsequently, a thin oxide film is grown covering the main surface of the substrate. Next, a nitride film is grown and subjected to a patterning so that the nitride film is left on the thin oxide film in the NMOS region 5, in the PMOS region 7, in a base region and in a collector deep contact region of the bipolar transistor 9. A field oxide film 10 is then formed to a thickness of about 5000 Å (angstrom) by a thermal oxidation for device isolation. Subsequently, the nitride film is removed and then phosphorus ions are implanted into the collector deep contact region to form a so called $N^+$ deep contact 11 for a collector electrode. Next, the thin oxide film is removed by a wet etching and then an oxidation step is performed again to form a gate oxide film 12. As a result, a structure shown in FIG. 3 is obtained.

Figure 4:
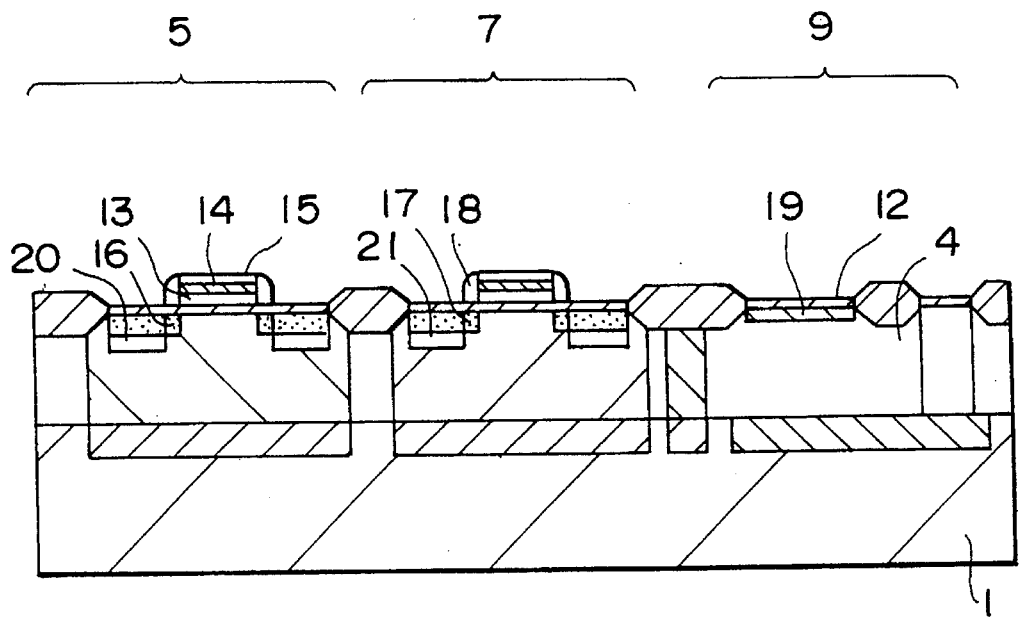
FIG. 4 is a cross-sectional view of the semiconductor IC according to the embodiment of the present invention in still another step of the manufacturing process.
Figure 5:
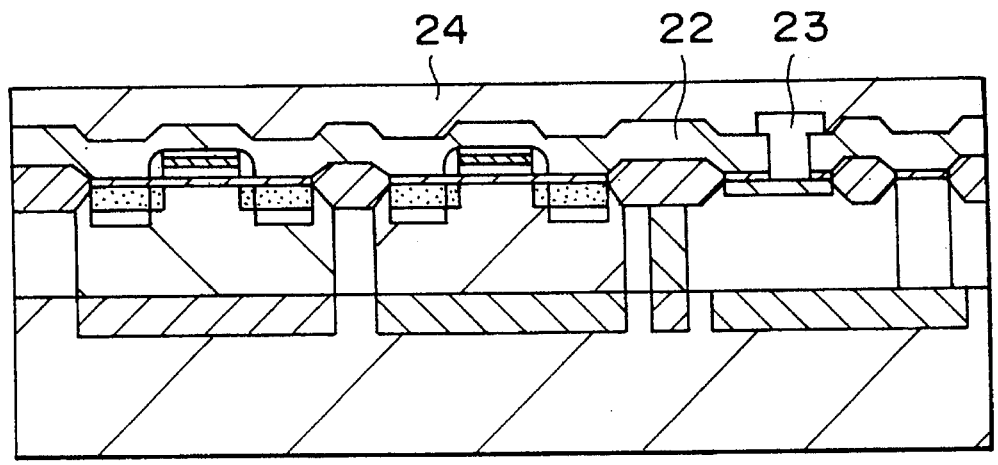
FIG. 5 is a cross-sectional view of the semiconductor IC according to the embodiment of the present invention in the final process step of the manufacturing process.

Subsequently, as shown in FIG. 4, a polysilicon film 13 is grown to a thickness of about 1000 Å and phosphorus ions are then diffused therein from $POCl_3$ (phosphorus oxytrichloride) source. A glass layer is then removed out of the polysilicon surface. Next, a tungsten silicide layer 14 is formed on the polysilicon layer 13 to a thickness of about 1000 Å by a sputter-deposition. Then, a polysilicon layer 15 is formed on the tungsten silicide layer 14 to a thickness of about 500 Å by sputter-deposition. The polysilicon layer 13, the tungsten silicide layer 14 and the polysilicon layer 15 are patterned to form a designed pattern, whereby a three-layer laminated gate electrode is obtained.

Subsequently, phosphorus ions are implanted into the NMOS region 5 at a low concentration to form an LDD phosphorus region 16 while boron ions are implanted into the PMOS region 7 at a low concentration to form an LDD boron region 17. An oxide film is grown to a thickness of about 2000 Å and then anisotropically etched to form sidewall spacers 18 on the both sides of each gate electrode. The anisotropic etching removes the gate oxide film 12 covering the base layer 19 of the bipolar region 9 causing the silicon epitaxial layer 4 to be exposed.

Since the polysilicon layer 15 has been formed on the tungsten silicide layer 14 of each gate electrode, the etching for forming the sidewall spacers 18 does not attack the tungsten silicide layer 14 to be worn away. Hence, tungsten particulates do not adhere to the epitaxial layer 4 in the base region 9. Accordingly, the Ar sputter-etching process for removing the scattered tungsten particulates is not necessary in the present embodiment. Hence, it is possible to omit a step for photoresist patterning for masking the surface of the substrate except for the base region.

After forming a thin oxide film covering the entire region boron ions are then implanted into the base region 19. Then, arsenic ions are implanted into the NMOS region 5 to form source and drain regions 20 of the NMOSFET while $BF_2^+$ ions are implanted into the PMOS region 7 to form the source and drain regions 21 of the PMOSFET. A structure illustrated in FIG. 4 is thus obtained. The process will now be described with reference to FIG. 5.

Subsequently, an oxide film 22 for interlayer insulation is grown covering the entire main surface of the substrate 1. Then, a contact-hole is formed in the bipolar region 9 at a position where an emitter of the bipolar transistor is to be formed. A polysilicon film is then grown to a thickness of about 2000 Å over the entire oxide film 22 including the inside of the contact-hole. The polysilicon film is subjected to an ion-implantation step for introduction of arsenic ions and then patterned to form an emitter electrode 23. Next, an interlayer insulating film 24 is grown and then subjected to a planarization step. Contact-holes are formed at designed locations, following which a second conductive layer made of an aluminum film is deposited. Thus provided is a BiCMOS IC wherein a bipolar transistor and a MOSFET having an LDD structure are formed on a common semiconductor substrate.

In the embodiment as described above, a laminated gate electrode having a top layer not containing tungsten is employed in a BiCMOS IC. As a result, when an anisotropic etching is carried out to form sidewall spacers for obtaining the LDD structure, tungsten particulates do not scatter or adhere to a silicon substrate in the base region of a bipolar transistor. Those sidewall spacers are made of an insulator so that they do not increase the equivalent gate length of a MOSFET.

Since the process as described above does not involve the step for removing the tungsten particulates out of the base region of the silicon substrate by etching the surface of the substrate accompanied by forming a patterned photoresist, it is possible to manufacture a semiconductor IC having a highly integrated BiCMOS structure by a simple method without deteriorating the performance thereof.

Alternatively, a gate electrode may be formed in some other multilayer structure on the conditions that an anisotropic etching for forming sidewall spacers of an LDD structure does not cause any scattering of tungsten.

Although the present invention is described with reference to the preferred embodiments, the present invention is not limited to such embodiments and it will be obvious for those skilled in the art that various modifications or alterations can be easily made based on the above embodiments within the scope of the present invention.

What is claimed is:

1. A semiconductor integrated circuit comprising: a semiconductor substrate having a main surface; at least one MOSFET formed on said main surface and having a lightly doped drain, a gate electrode laminate and a sidewall spacer formed on a side of said gate electrode laminate adjacent to said lightly doped drain, said gate electrode laminate including a top layer made of a material containing substantially no refractory metal; an insulating layer formed on said gate electrode laminate and said sidewall spacer; and a bipolar transistor formed on said main surface having an emitter electrode formed on and penetrating said insulating layer, said top layer preventing refractory metal particulates from beneath said top layer from contaminating a base region of said bipolar transistor during formation of said sidewall spacer.

2. A semiconductor integrated circuit as defined in claim 1, wherein said top layer is made of polysilicon.

3. A semiconductor integrated circuit as defined in claim 1, wherein said gate electrode laminate includes a tungsten silicide layer beneath said top layer.

4. A semiconductor integrated circuit as defined in claim 3, wherein said gate electrode laminate further includes a second polysilicon layer beneath said tungsten silicide layer.

5. A semiconductor integrated circuit as defined in claim 1, wherein said at least one MOSFET include a PMOSFET and an NMOSFET.

6. A semiconductor integrated circuit comprising: a semiconductor substrate having a main surface; at least one MOSFET formed on said main surface and having a lightly doped drain, a gate electrode laminate and a sidewall spacer formed on a side of said gate electrode laminate adjacent to said lightly doped drain, said gate electrode laminate including a first polysilicon layer, a tungsten silicide layer and a second polysilicon layer consecutively formed in this order above said main surface; and a bipolar transistor formed on said main surface, said second polysilicon layer preventing tungsten silicide particulates from contaminating a base region of said bipolar transistor during formation of said sidewall spacer.

7. A semiconductor integrated circuit as defined in claim 6, wherein said at least one MOSFET include a PMOSFET and an NMOSFET.

* * * * *